(12) United States Patent
Byun et al.

(10) Patent No.: US 11,520,091 B2
(45) Date of Patent: Dec. 6, 2022

(54) COLORING PATTERN STRUCTURE AND METHOD OF MANUFACTURING THE SAME

(71) Applicant: KOREA INSTITUTE OF SCIENCE AND TECHNOLOGY, Seoul (KR)

(72) Inventors: Ji Young Byun, Seoul (KR); So Hye Cho, Seoul (KR); Seung Yong Lee, Seoul (KR); Kwang-Deok Choi, Seoul (KR); In Uk Baek, Seoul (KR); Yun Hee Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 505 days.

(21) Appl. No.: 16/684,016

(22) Filed: Nov. 14, 2019

(65) Prior Publication Data
US 2020/0310016 A1 Oct. 1, 2020

(30) Foreign Application Priority Data

Mar. 27, 2019 (KR) .......................... 10-2019-0035380

(51) Int. Cl.
| | | |
|---|---|---|
| C23C 14/00 | (2006.01) | |
| G02B 5/28 | (2006.01) | |
| C23C 14/08 | (2006.01) | |
| C23C 14/06 | (2006.01) | |
| B32B 15/00 | (2006.01) | |
| B32B 3/10 | (2006.01) | |
| B32B 3/12 | (2006.01) | |

(52) U.S. Cl.
CPC .............. *G02B 5/285* (2013.01); *B32B 15/00* (2013.01); *C23C 14/0036* (2013.01); *C23C 14/0635* (2013.01); *C23C 14/0682* (2013.01); *C23C 14/083* (2013.01); *B32B 3/10* (2013.01); *B32B 3/12* (2013.01)

(58) Field of Classification Search
CPC ...... B82Y 30/00; B82Y 40/00; G02B 5/0816; G02B 5/285; C23C 14/3464; C23C 14/0015
See application file for complete search history.

(56) References Cited

U.S. PATENT DOCUMENTS

| | | | |
|---|---|---|---|
| 10,550,041 B1 * | 2/2020 | Korenstein | ......... C04B 35/5156 |
| 2017/0192141 A1 * | 7/2017 | Bon Saint Come | ......................... C03C 17/3663 |
| 2021/0115550 A1 * | 4/2021 | Byun | ...................... C23C 16/01 |

FOREIGN PATENT DOCUMENTS

| | | |
|---|---|---|
| KR | 1020110131719 A | 12/2011 |
| KR | 101529528 B1 | 6/2015 |
| KR | 101674316 B1 | 11/2016 |

\* cited by examiner

*Primary Examiner* — Jaehwan Oh

(74) *Attorney, Agent, or Firm* — Rabin & Berdo, P.C.

(57) ABSTRACT

Provided is a coloring pattern structure. The coloring pattern structure includes: a substrate; a light-transmitting dielectric layer formed on at least one surface of the substrate; and a composite material layer disposed on an upper surface of the light-transmitting dielectric layer and formed of a metal and a first material not having a thermodynamic solid solubility in the metal, wherein the metal included in the composite material layer has a pattern coated only on portions of the upper surface of the light-transmitting dielectric layer, and the first material is coated on the remaining area where the metal is not coated.

20 Claims, 9 Drawing Sheets

FIG. 5

| EXPERIMENTAL EXAMPLE | SURFACE PHOTOGRAPH | EXPERIMENTAL EXAMPLE | SURFACE PHOTOGRAPH |
|---|---|---|---|
| COMPARATIVE EXAMPLE 1a | | COMPARATIVE EXAMPLE 2a | |
| COMPARATIVE EXAMPLE 1b | | COMPARATIVE EXAMPLE 2b | |
| COMPARATIVE EXAMPLE 1c | | COMPARATIVE EXAMPLE 2c | |
| COMPARATIVE EXAMPLE 1d | | COMPARATIVE EXAMPLE 2d | |
| COMPARATIVE EXAMPLE 1e | | COMPARATIVE EXAMPLE 2e | |
| COMPARATIVE EXAMPLE 1f | | COMPARATIVE EXAMPLE 2f | |
| COMPARATIVE EXAMPLE 1g | | COMPARATIVE EXAMPLE 2g | |
| COMPARATIVE EXAMPLE 1i | | COMPARATIVE EXAMPLE 2i | |
| COMPARATIVE EXAMPLE 1j | | COMPARATIVE EXAMPLE 2j | |

FIG. 8
| COMPARATIVE EXAMPLE 3c | EXPERIMENTAL EXAMPLE 3a | EXPERIMENTAL EXAMPLE 3b |
|---|---|---|
|  |  |  |
| COMPARATIVE EXAMPLE 3i | EXPERIMENTAL EXAMPLE 3c | |
|  |  | |
| COMPARATIVE EXAMPLE 3j | EXPERIMENTAL EXAMPLE 3e | EXPERIMENTAL EXAMPLE 3f |
|  |  |  |

COLORING PATTERN STRUCTURE AND METHOD OF MANUFACTURING THE SAME

CROSS-REFERENCE TO RELATED APPLICATION

This application claims the benefit of Korean Patent Application No. 10-2019-0035380, filed on Mar. 27, 2019, in the Korean Intellectual Property Office, the disclosure of which is incorporated herein in its entirety by reference.

BACKGROUND

1. Field

The present invention relates to a pattern structure and a method of manufacturing the same, and more particularly, to a structure having a pattern capable of expressing various interference colors by light on at least one surface thereof, and a method of manufacturing the same.

2. Description of the Related Art

Recently, consumption patterns of consumers have be changed in such a way that purchasing decisions are affected by both design and function rather than function alone which has conventionally affected buying behaviors. According to this trend, research has been conducted to develop attractive materials to impulse buying emotion of consumers in the field of material technology. Emotion refers to a state of feeling a stimulation or a change in stimulation. Although there have been many studies to satisfy such emotion in the field of material technology, the easiest way to appeal eyes of consumers is changing colors of products.

Most of the metallic materials available in everyday life such as aluminum and stainless steel, except for gold, copper, brass, and the like, exhibit achromatic color such as white or light gray color. If fabrication of various colors of metal, particularly surfaces of metal expressing clear colors while maintaining glittering and shining properties of surface gloss of metal, is possible, infinite utilization thereof is expected.

Coloring methods known to data will be described briefly. The simplest method is to paint. Although a variety of colors may be realized by paining, it is disadvantageous in that metal gloss is difficult to be maintained. Secondly, a method of coating a nitride, a carbide, a carbonitride, and the like on the surface of metal may be used. This method is known to provide durability to the surface of metal as well as a color thereto. However, it is disadvantageous in that various colors cannot be provided thereby. Thirdly, anodization is known. However, it is disadvantageous in that metal applicable to this method is limited to aluminum and titanium. In the case of aluminum, a color is expressed by injecting a dye into an anodized oxide film. Since the dye is vulnerable to UV radiation, the color fades over time. In addition, it is also disadvantageous in that metal gloss cannot be maintained thereby. Fourthly, a color of a metal may be controlled by adding an alloy element to the metal. Although this method has been studied recently, it is disadvantageous in that various colors cannot be expressed thereby.

SUMMARY

Thus, the present invention has been proposed to solve various problems including the above problems, and an object of the present invention is to provide a coloring pattern structure capable of realizing a variety of colors using metal patterns formed by a simple manufacturing process and a method of manufacturing the same. However, these problems to be solved are illustrative and the scope of the present invention is not limited thereby.

Additional aspects will be set forth in part in the description which follows and, in part, will be apparent from the description, or may be learned by practice of the presented embodiments.

According to an aspect of the present invention to achieve the object, provided is a coloring pattern structure.

The coloring pattern structure includes: a substrate; a light-transmitting dielectric layer formed on at least one surface of the substrate; and a composite material layer disposed on an upper surface of the light-transmitting dielectric layer and formed of a metal and a first material not forming a thermodynamically stable solid solution with the metal, wherein the metal included in the composite material layer has a pattern coated only on portions of the upper surface of the light-transmitting dielectric layer, and the first material is coated on the remaining area where the metal is not coated.

According to another aspect of the present invention to achieve the object, provided is a coloring pattern structure including: a substrate; a light-transmitting dielectric layer formed on at least one surface of the substrate; and a metal pattern formed on an upper surface of the light-transmitting dielectric layer, wherein the metal pattern is formed by coating a metal on portions of the light-transmitting dielectric layer.

In the coloring pattern structure, the metal may include one of silver (Ag), aluminum (Al), gold (Au), cobalt (Co), copper (Cu), nickel (Ni), palladium (Pd), platinum (Pt), and rhenium (Re).

In the coloring pattern structure, the first material may include one of carbon (C), silicon (Si), germanium (Ge), and an Si—Ge alloy.

In the coloring pattern structure, the substrate may include a pure metal selected from iron (Fe), aluminum (Al), copper (Cu), nickel (Ni), magnesium (Mg), zinc (Zn), titanium (Ti), chromium (Cr), silver (Ag), gold (Au), platinum (Pt), and palladium (Pd) or any alloy thereof.

In the coloring pattern structure, the light-transmitting dielectric layer may include one of $TiO_2$, $Al_2O_3$, MgO, $SiO_2$, $Si_3N_4$, and indium tin oxide (ITO).

In the coloring pattern structure, the light-transmitting dielectric layer may have a thickness of about 5 nm to about 300 nm.

According to another aspect of the present invention to achieve the object, provided is a method of manufacturing a coloring pattern structure.

The method of manufacturing a coloring pattern structure includes: forming a light-transmitting dielectric layer on at least one surface of a substrate; and forming a composite material layer including a metal and a first material not forming a thermodynamically stable solid solution with the metal on an upper surface of the light-transmitting dielectric layer, wherein the metal included in the composite material layer has a pattern coated only on portions of the upper surface of the light-transmitting dielectric layer, and the first material is coated on the remaining area where the metal is not coated.

In the method of manufacturing a coloring pattern structure, the pattern of the metal may be formed by selectively removing the first material from the composite material layer to remain the metal.

In the method of manufacturing a coloring pattern structure, the forming of the composite material layer may include co-depositing the metal and the first material on one surface of the light-transmitting dielectric layer.

In the method of manufacturing a coloring pattern structure, the co-depositing may be performed by separately preparing deposition sources of the metal and the first material respectively, and depositing the metal and the first material on the upper surface of the light-transmitting dielectric layer from each of the deposition sources.

In the method of manufacturing a coloring pattern structure, the co-depositing may be performed by using a mixture or alloy of the metal and the first material as a single deposition source.

In the method of manufacturing a coloring pattern structure, when the first material includes carbon, the metal may include one of silver (Ag), aluminum (Al), gold (Au), cobalt (Co), copper (Cu), nickel (Ni), palladium (Pd), platinum (Pt), rhenium (Re), and zinc (Zn).

In the method of manufacturing a coloring pattern structure, when the first material includes one of silicon (Si), germanium (Ge), and an Si—Ge alloy, the metal may include one of silver (Ag), gold (Au), aluminum (Al), and zinc (Zn).

In the method of manufacturing a coloring pattern structure, the pattern of the metal may have a shape in which a plurality of metal nanoparticles spaced apart from each other are distributed.

In the method of manufacturing a coloring pattern structure, the pattern of the metal may have a channel shape extending with a plurality of widths and lengths.

In the method of manufacturing a coloring pattern structure, the first material may be removed by chemical etching.

In the method of manufacturing a coloring pattern structure, the first material may be removed by a combustion process.

BRIEF DESCRIPTION OF THE DRAWINGS

These and/or other aspects will become apparent and more readily appreciated from the following description of the embodiments, taken in conjunction with the accompanying drawings in which:

FIG. 5 shows photographs of surfaces of pattern structure samples according to comparative examples;

FIGS. 6 to 8 are photographs of surfaces of pattern structure samples according to experimental examples arranged according to substrates.

DETAILED DESCRIPTION

Hereinafter, embodiments of the present invention will be described in detail with reference to the accompanying drawings. These embodiments are provided to fully convey the concept of the present invention to those of ordinary skill in the art. The present invention may, however, be embodied in many different forms and should not be construed as limited to the exemplary embodiments set forth herein. Rather, these embodiments are provided so that this disclosure will be thorough and complete, and will fully convey the scope of the invention to those skilled in the art.

A structure according to an embodiment of the present invention has a pattern capable of realizing various interference colors on at least one surface thereof, and thus the structure is referred to as "coloring pattern structure" throughout the specification and claims.

FIGS. 1A to 1D schematically illustrate coloring pattern structures according to embodiments of the present invention.

Figure 1A:
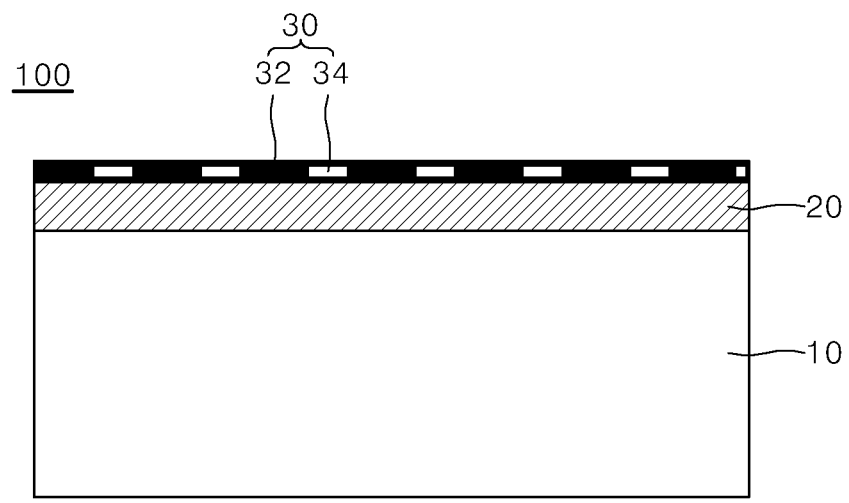
FIGS. 1A to 1D schematically illustrate coloring pattern structures according to embodiments of the present invention.

Referring to FIG. 1A, a coloring pattern structure 100 includes a substrate 10 and a light-transmitting dielectric layer 20 formed on the substrate 10.

For example, the substrate 10 is formed of a metallic material. The metallic material include a pure metal selected from iron (Fe), aluminum (Al), copper (Cu), nickel (Ni), magnesium (Mg), zinc (Zn), titanium (Ti), chromium (Cr), silver (Ag), gold (Au), platinum (Pt), and palladium (Pd) or any alloy thereof (e.g., stainless steel, brass, bronze, cupronickel, and duralumin).

The light-transmitting dielectric layer 20 is formed on at least one surface of the substrate 10. The light-transmitting dielectric layer 20 may include one of $TiO_2$, $Al_2O_3$, MgO, $SiO_2$, $Si_3N_4$, and indium tin oxide (ITO) and have a thickness of about 5 nm to about 300 nm. The light-transmitting dielectric layer 20 may be formed by a method of manufacturing thin films, such as reactive sputtering and chemical vapor deposition.

A composite material layer 30 is formed on an upper surface of the light-transmitting dielectric layer 20. The composite material layer 30 includes a metal 32 and a first material 34 not having a thermodynamic solid solubility in the metal 32. The metal 32 included in the composite material layer 30 is coated only on portions of the upper surface of the light-transmitting dielectric layer 20 to form a pattern, and the first material 34 is coated on the remaining area where the metal 32 is not coated.

The composite material layer 30 may be formed by co-deposition of the metal 32 and the first material 34 on one surface of the light-transmitting dielectric layer 20. The co-deposition refers to a method of simultaneously depositing a plurality of materials on a substrate.

For example, the co-deposition may be performed by separately preparing deposition sources of the metal 32 the first material 34 respectively, and depositing the metal 32 and the first material 34 on the substrate 10 from each of the deposition sources. Examples of the co-deposition may include co-evaporation using separate evaporation sources, co-sputtering using separate targets for deposition, and arc plasma deposition. In the case of co-deposition using separate deposition sources, a composition ratio or an area ratio between the metal 32 and the first material 34 in the composite material layer 30 may be controlled by adjusting amounts of the metal 32 and the first material 34 respectively vaporized from the deposition sources.

As another example of co-deposition, a method of forming the composite material layer 30 on the substrate 10 by simultaneously vaporizing the metal 32 and the first material 34 from a single deposition source including a mixture or alloy of the metal 32 and the first material 34. Since the single deposition source is used in this case, a composition ratio or an area ratio between the metal 32 and the first material 34 may be controlled by adjusting the composition ratio between the metal 32 and the first material 34 contained in the deposition source.

Figure 9:
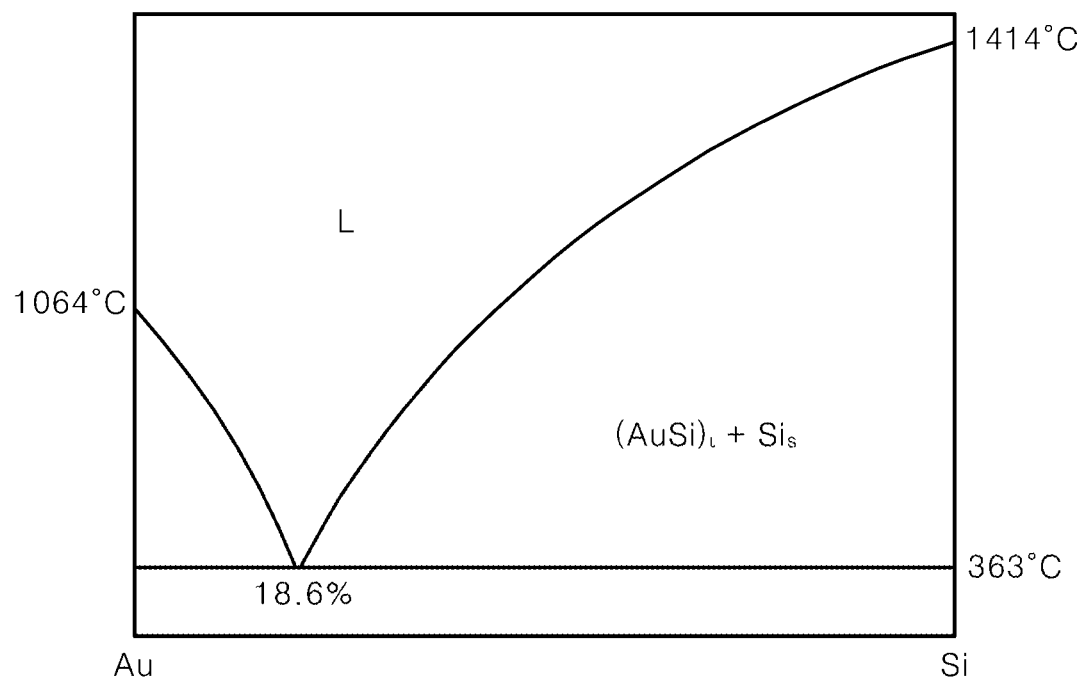
FIG. 9 is an Au—Si binary phase diagram.

The composite material layer 30 is formed of the metal 32 and the first material 34 each not having a thermodynamic solid solubility. For example, when the first material 34 constituting the composite material layer 30 includes carbon (C), the metal 32 may include one of silver (Ag), aluminum (Al), gold (Au), cobalt (Co), copper (Cu), nickel (Ni), palladium (Pd), platinum (Pt), rhenium (Re), and zinc (Zn). When the first material 34 includes one of silicon (Si), germanium (Ge), and an Si—Ge alloy, the metal 32 may include one of silver (Ag), gold (Au), aluminum (Al), and zinc (Zn). FIG. 9 illustrates an Au—Si binary phase diagram. Referring to FIG. 9, there are no mutual solid solubility between Au and Si in the thermodynamic equilibrium.

Figure 1B:
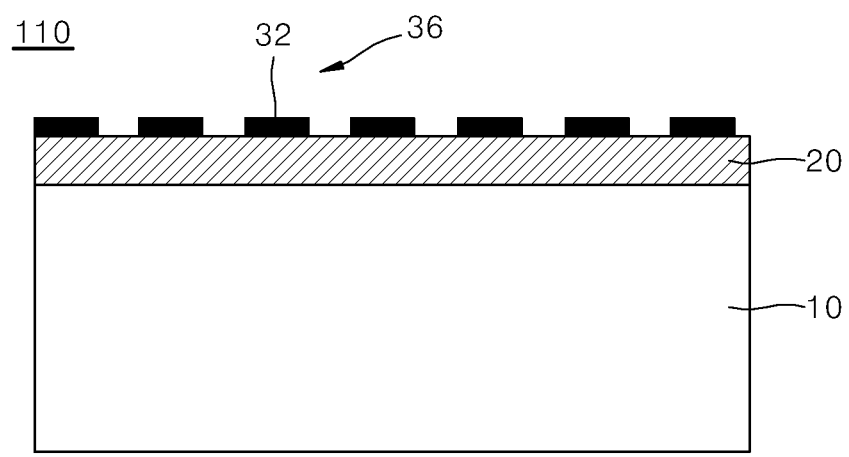
Figure 1C:
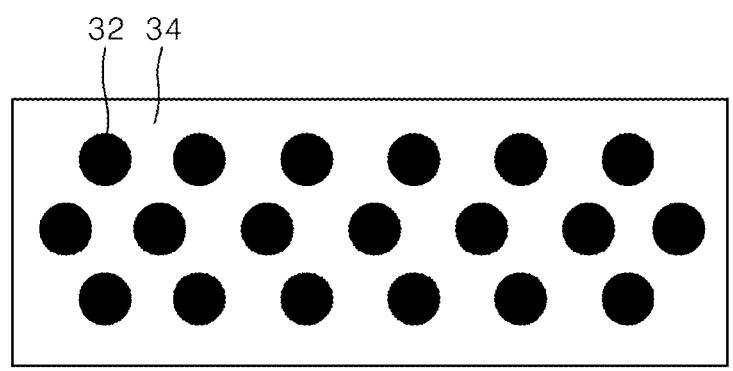

When the metal 32 and the first material 34 which are mutually insoluble are co-deposited on the substrate 10 as described above, a microstructure of a formed thin film has a pattern in which the metal 32 and the first material 34 are coated on separate areas of the surface of the substrate 10 with a boundary line therebetween as shown in FIG. 1C.

The method of forming the composite material layer 30 may be selected from methods including the above-described methods according to the types of the metal 32 and the first material 34, and the shape of the pattern of the composite material layer 30 is determined by the types.

Figure 2A:
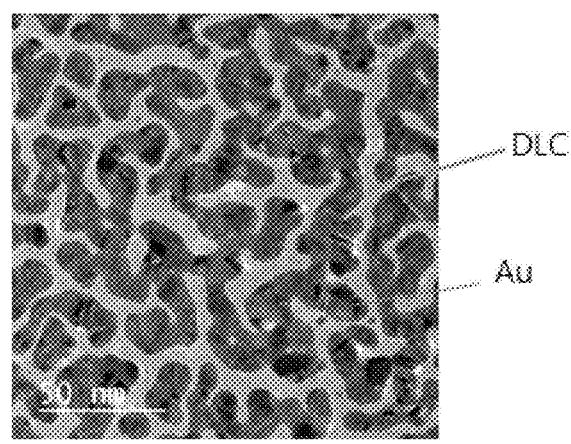
FIGS. 2A and 2B show transmission electron microscope (TEM) images of microstructures of surfaces of coloring pattern structure according to experimental examples of the present invention.
Figure 2B:
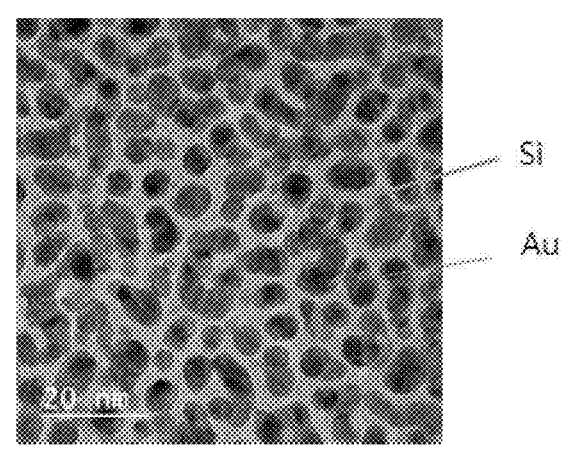

For example, FIG. 2A shows a pattern of a composite material layer 30 in which gold (Au) is used as the metal 32 and carbon (C) is used as the first material 34, and FIG. 2B shows a pattern of a composite material layer 30 in which gold (Au) is used as the metal 32 and silicon (Si) is used as the first material 34.

Referring to FIG. 2A, when the composite material layer 30 is formed of the Au—C binary compound, the pattern may have a shape in which Au is coated on portions of the substrate 10 in a channel form extending with a plurality of widths and lengths and C is coated on the remaining area of the substrate 10 where Au is not coated in a diamond like carbon (DLC) form.

Referring to FIG. 2B, when the composite material layer 30 is formed of the Au—Si binary compound, the pattern may have a shape in which a plurality of Au nanoparticles spaced apart from each other are dispersed, and Si is coated on spaces between the Au nanoparticles.

Another example of the coloring pattern structure is illustrated in FIG. 1B. Referring to FIG. 1B, the coloring pattern structure 110 may include a substrate 10, a light-transmitting dielectric layer 20 formed on at least one surface of the substrate 10, and a metal pattern 36 formed on an upper surface of the light-transmitting dielectric layer 20. The metal pattern 36 has a shape in which a metal 32 is coated on portions of the light-transmitting dielectric layer 20.

Figure 1D:
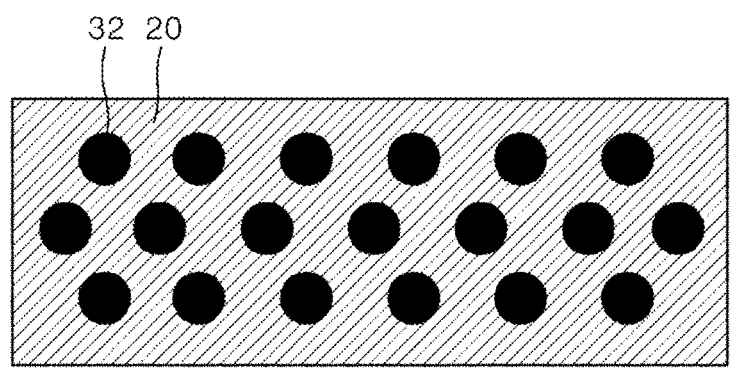

The metal pattern 36 may be formed by selectively removing the first material 34 from the composite material layer 30 of the pattern structure 100 illustrated in FIG. 1A to remain the metal 32. FIG. 1D shows a plan view of the metal pattern 36.

A method of selectively removing the first material 34 may be selected according to the types of the metal 32 and the first material 34.

For example, when Au is used as the metal 32 and C is used as the first material 34 in the present invention, Au may be remained by removing C via a combustion process.

As another example, when Au is used as the metal 32 and Si is used as the first material 34, Au may be remained by removing Si by a wet etching method using an etching solution such as HNA, KOH, TMAH, and EDP. Alternatively, Au may be remained by removing Si by a dry etching method using an etching gas.

According to embodiments of the present invention, wavelength bands of absorbed light among wavelengths of light incident on the substrate 10 may be controlled by modifying the thickness of the light-transmitting dielectric layer 20 formed on the substrate 10 or the thickness, size, or shape of the composite material layer 30 or the metal pattern 36 formed thereon alone or in combination. Thus, various colors may be realized on the surface of the metal.

Hereinafter, the present invention will be described in more detail with reference to the following examples. However, the following experimental examples are merely presented to exemplify the present invention, and the scope of the present invention is not limited thereto.

Experimental Examples

Pattern structure samples were prepared under various experimental conditions. Metallic materials formed of stainless steel (SUS), Al, or Cu were used as substrates to prepare the pattern structure samples. Each of the pattern sample was prepared by depositing $TiO_2$ on the metal substrate having a size of 1 cm×1 cm by reactive sputtering. Subsequently, an Au—C composite material layer was formed on $TiO_2$ by co-sputtering using an Au target and a graphite target, and an Au—Si composite materials layer was formed on $TiO_2$ using an Au target and an Si target.

Hereinafter, types of the metal substrates, thicknesses of the dielectric layers, and types of the composite material layers used in experimental examples and comparative examples are shown in Tables 1 and 2.

TABLE 1

| Comparative Example | Metal substrate | Thickness of $TiO_2$ (nm) | Composite material layer |
| --- | --- | --- | --- |
| Comparative Example 1a | SUS | 6 | — |
| Comparative Example 1b | SUS | 12 | — |
| Comparative Example 1c | SUS | 30 | — |
| Comparative Example 1d | SUS | 35 | — |
| Comparative Example 1e | SUS | 40 | — |
| Comparative Example 1f | SUS | 45 | — |
| Comparative Example 1g | SUS | 50 | — |
| Comparative Example 1h | SUS | 70 | — |
| Comparative Example 1i | SUS | 80 | — |
| Comparative Example 1j | SUS | 100 | — |
| Comparative Example 2a | Al | 6 | — |
| Comparative Example 2b | Al | 12 | — |
| Comparative Example 2c | Al | 30 | — |
| Comparative Example 2d | Al | 35 | — |
| Comparative Example 2e | Al | 40 | — |
| Comparative Example 2f | Al | 45 | — |
| Comparative Example 2g | Al | 50 | — |
| Comparative Example 2h | Al | 70 | — |
| Comparative Example 2i | Al | 80 | — |
| Comparative Example 2j | Al | 100 | — |

TABLE 2

| Experimental Example | Metal substrate | Thickness of $TiO_2$ (nm) | Composite material layer |
| --- | --- | --- | --- |
| Experimental Example 1a | SUS | 30 | Au—C |
| Experimental Example 1b | SUS | 30 | Au—Si |
| Experimental Example 1c | SUS | 80 | Au—C |
| Experimental Example 1d | SUS | 80 | Au—Si |
| Experimental Example 1e | SUS | 100 | Au—C |

TABLE 2-continued

| Experimental Example | Metal substrate | Thickness of TiO$_2$ (nm) | Composite material layer |
|---|---|---|---|
| Experimental Example 1f | SUS | 100 | Au—Si |
| Experimental Example 2a | Al | 30 | Au—C |
| Experimental Example 2c | Al | 80 | Au—C |
| Experimental Example 2e | Al | 100 | Au—C |
| Experimental Example 2f | Al | 100 | Au—Si |
| Experimental Example 3a | Cu | 30 | Au—C |
| Experimental Example 3b | Cu | 30 | Au—Si |
| Experimental Example 3c | Cu | 80 | Au—C |
| Experimental Example 3e | Cu | 100 | Au—C |
| Experimental Example 3f | Cu | 100 | Au—Si |

FIGS. 2A and 2B show transmission electron microscopy (TEM) images of microstructures of surfaces of coloring pattern structure according to experimental examples of the present invention. FIG. 2A shows a thin film of an Au—C composite material prepared according to Experimental Example 1a, and FIG. 2B shows a thin film of an Au—Si composite material prepared according to Experimental Example 1 b.

Referring to FIG. 2A, it was confirmed that the Au—C composite material layer was formed, and an Au pattern in the form of channel extending with different widths and a DLC pattern surrounding the same were observed.

Referring to FIG. 2B, it was confirmed that the Au—Si composite material layer was formed, and a pattern in which a plurality of Au nanoparticles spaced apart from each other were dispersed was observed.

Figure 3:
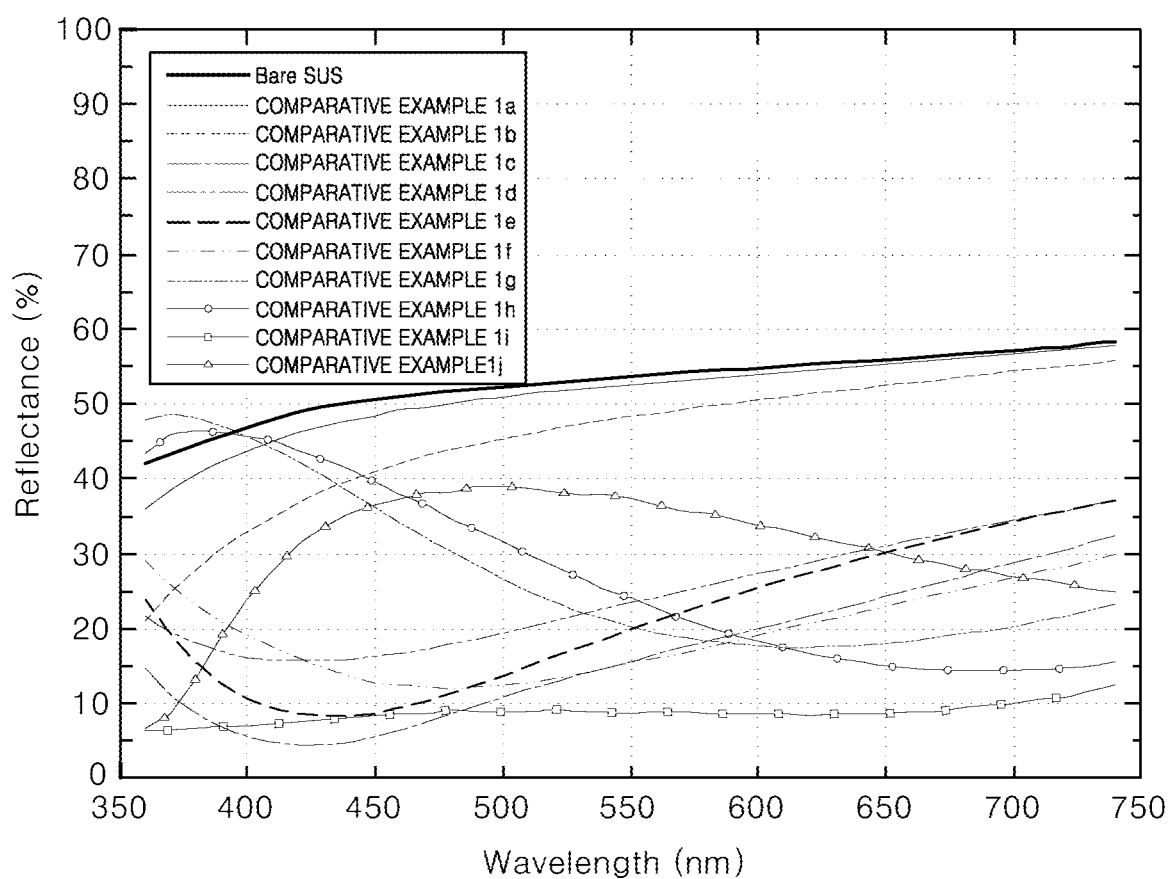
FIGS. 3 and 4 are graphs showing reflectances of pattern structure samples according to comparative examples with respect to wavelengths.
Figure 4:
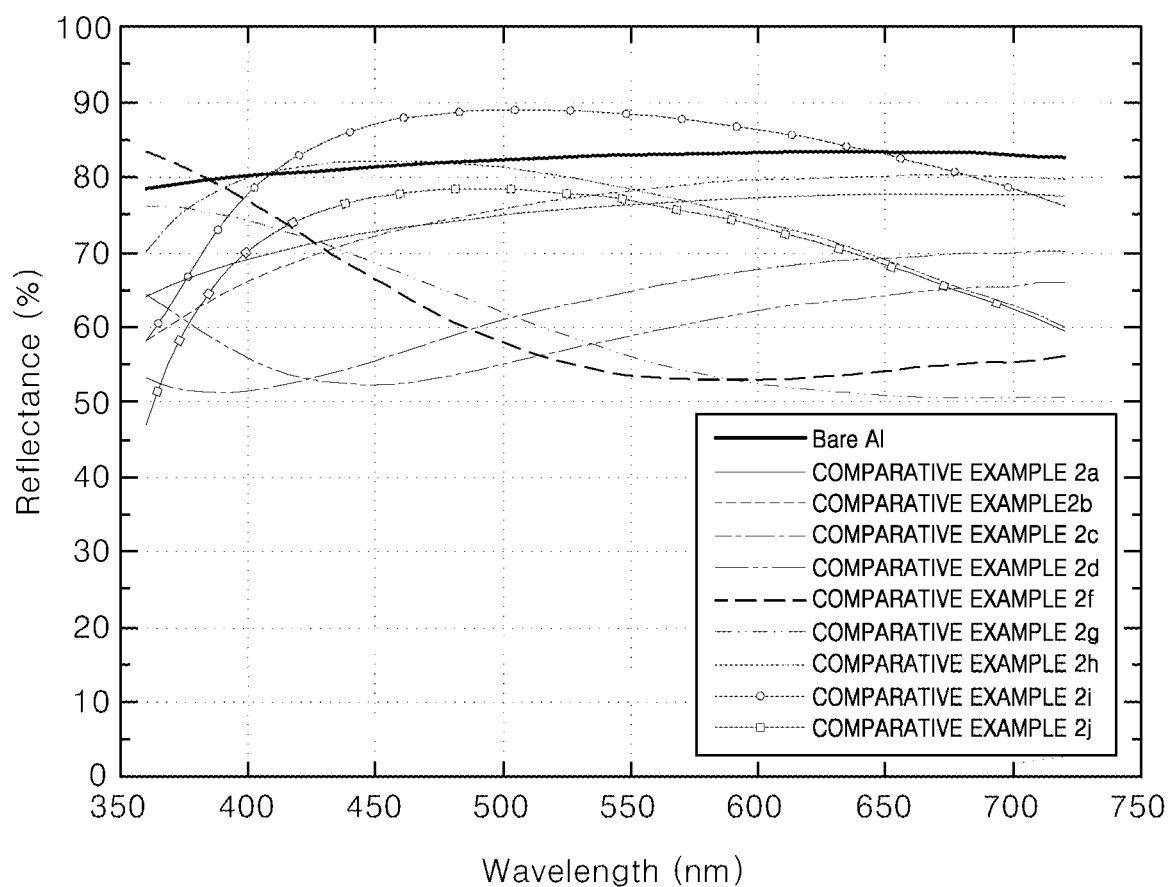

FIGS. 3 and 4 are graphs showing reflectances of pattern structure samples according to comparative examples according to wavelengths.

Referring to FIG. 3, when the SUS substrate was used, a position of the absorption peak shifted to a longer wavelength band as the thickness of the TiO$_2$ dielectric layer increased. In this regard, when the thickness of the TiO$_2$ dielectric layer was greater than 70 nm, the absorption peak was observed in the infrared ray (IR) wavelength band, and a highest reflectance was observed in the visible wavelength band.

Referring to FIG. 4, when the Al substrate was used, it was confirmed that a position of an absorption peak shifted to a longer wavelength band as the thickness of the TiO$_2$ dielectric layer increased. When the Al substrate was used, absorption decreased unlike when using the SUS substrate. In this regard, when the thickness of the TiO$_2$ dielectric layer was greater than 50 nm, an absorption peak was observed in the IR wavelength band, and a highest reflectance was observed in the visible wavelength band. Thus, it may be confirmed that when only the TiO$_2$ dielectric layer is deposited on the Al metal substrate, a high reflectance of 50% or higher was observed and it is difficult to realize a clear color.

FIG. 5 shows photographs of surfaces of pattern structure samples according to comparative examples.

Referring to FIG. 5, the colors of the surfaces of the pattern structure samples vary according to the type of the substrate. In addition, as shown in FIGS. 3 and 4, the surfaces have various colors according to the thickness of the TiO$_2$ dielectric layer.

Figure 6:
Figure 7:

FIGS. 6 to 8 are photographs of surfaces of pattern structure samples according to experimental examples arranged according to substrates.

Comparative Examples 1c, 1i, and 1j of FIG. 6 show results of using the SUS substrate and the TiO$_2$ dielectric layers having thicknesses of 30, 80, and 100 nm, respectively. Experimental Examples 1a, 1c, and 1e show results of forming the Au—C composite material layer on the samples of Comparative Examples 1c, 1i, and 1j, respectively, and Experimental Examples 1 b, 1d, and 1f show results of forming the Au—Si composite material layer on the samples of Comparative Examples 1c, 1i, and 1j, respectively.

Referring to FIG. 6, although changes in color were clearly distinguished according to the thickness of the TiO$_2$ dielectric layer when the SUS substrate was used, the samples exhibited similar colors regardless of the type of the composite material layer. Particularly, when the Au—Si binary compound was used to form the composite material layer, the effect of changing color increased as the thickness of the TiO$_2$ dielectric layer decreased.

Comparative Examples 2c, 2i, and 2j of FIG. 7 show results of using the Al substrate and the TiO$_2$ dielectric layers having thicknesses of 30, 80, and 100 nm, respectively. Experimental Examples 2a, 2c, and 2e show results of forming the Au—C composite material layer on the samples of Comparative Examples 2c, 2i, and 2j, respectively, and Experimental Example 2f shows a result of forming the Au—Si composite material layer on the sample of Comparative Example 2j.

Referring to FIG. 7, it was confirmed that changes in color were clearly distinguished according to the thickness of the TiO$_2$ dielectric layer as well as the type of the composite material layer when the Ai substrate was used.

Comparative Examples 3c, 3i, and 3j of FIG. 8 show results of using the Cu substrate and the TiO$_2$ dielectric layers having thicknesses of 30, 80, and 100 nm, respectively. Experimental Examples 3a, 3c, and 3e show results of forming the Au—C composite material layer on the samples of Comparative Examples 3c, 3i, and 3j, respectively, and Experimental Examples 3b and 3f show results of forming the Au—Si composite material layer on the samples of Comparative Examples 3c and 3j, respectively.

Referring to FIG. 8, it was confirmed that changes in color were clearly distinguished according to the thickness of the TiO$_2$ dielectric layer as well as according to the type of the composite material layer when the Cu substrate was used. In the case of using the Cu substrate, the effect of changing color increased as the thickness of the TiO$_2$ dielectric layer decreased similarly to the case of using the SUS substrate.

As shown in FIGS. 6 to 8, it was confirmed that color changes according to the type of the metal substrate although the structures of the color expression layers formed on the metal substrate were the same. This is because SUS, Al, and Cu have different reflectances in the visible range. Based thereon, the color may be adjusted by changing the type of the metal substrate.

As described above, according to the manufacturing method of the present invention, colors of metal surfaces may be controlled in various ways only by a simple process. Thus, a color pattern structure having various colors and a method of manufacturing the same may be provided. However, the scope of the present invention is not limited by the effect.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A coloring pattern structure comprising:
    a substrate made of a metallic material;
    a light-transmitting dielectric layer disposed on at least one surface of the substrate; and a composite material layer disposed on an upper surface of the light-transmitting dielectric layer and comprising a metal and a first material not having a thermodynamic solid solubility in the metal,
wherein the metal included in the composite material layer has a pattern coated only on portions of the upper surface of the light-transmitting dielectric layer, and the first material is coated on the remaining area where the metal is not coated.

2. The coloring pattern structure of claim 1,
wherein the metal comprises one of silver (Ag), aluminum (Al), gold (Au), cobalt (Co), copper (Cu), nickel (Ni), palladium (Pd), platinum (Pt), and rhenium (Re).

3. The coloring pattern structure of claim 1,
wherein the first material comprises one of carbon (C), silicon (Si), germanium (Ge), and an Si—Ge alloy.

4. The coloring pattern structure of claim 1, wherein the substrate comprises a pure metal selected from iron (Fe), aluminum (Al), copper (Cu), nickel (Ni), magnesium (Mg), zinc (Zn), titanium (Ti), chromium (Cr), silver (Ag), gold (Au), platinum (Pt), and palladium (Pd) or any alloy thereof.

5. The coloring pattern structure of claim 1,
wherein the light-transmitting dielectric layer comprises one of $TiO_2$, $Al_2O_3$, MgO, $SiO_2$, $Si_3N_4$, and indium tin oxide (ITO).

6. The coloring pattern structure of claim 1,
wherein the light-transmitting dielectric layer has a thickness of about 5 nm to about 300 nm.

7. A coloring pattern structure comprising:
a substrate made of a metallic material;
a light-transmitting dielectric layer disposed on at least one surface of the substrate; and
a metal pattern disposed on an upper surface of the light-transmitting dielectric layer,
wherein the metal pattern includes metal coated on portions of the light-transmitting dielectric layer.

8. The coloring pattern structure of claim 7,
wherein the metal comprises one of silver (Ag), aluminum (Al), gold (Au), cobalt (Co), copper (Cu), nickel (Ni), palladium (Pd), platinum (Pt), and rhenium (Re).

9. The coloring pattern structure of claim 7,
wherein the substrate comprises a pure metal selected from iron (Fe), aluminum (Al), copper (Cu), nickel (Ni), magnesium (Mg), zinc (Zn), titanium (Ti), chromium (Cr), silver (Ag), gold (Au), platinum (Pt), and palladium (Pd) or any alloy thereof.

10. The coloring pattern structure of claim 7,
wherein the light-transmitting dielectric layer comprises one of $TiO_2$, $Al_2O_3$, MgO, $SiO_2$, $Si_3N_4$, and indium tin oxide (ITO).

11. The coloring pattern structure of claim 7,
wherein the light-transmitting dielectric layer has a thickness of about 5 nm to about 200 nm.

12. A method of manufacturing a coloring pattern structure, the method comprising:
forming a light-transmitting dielectric layer on at least one surface of a substrate, the substrate being made of a metallic material; and
forming a composite material layer including a metal and a first material not having a thermodynamic solid solubility in the metal on an upper surface of the light-transmitting dielectric layer,
wherein the metal included in the composite material layer has a pattern coated only on portions of the upper surface of the light-transmitting dielectric layer, and the first material is coated on the remaining area where the metal is not coated.

13. The method of claim 12,
wherein the pattern of the metal is formed by selectively removing the first material from the composite material layer, to remain the metal.

14. The method of claim 12,
wherein the forming of the composite material layer comprises co-depositing the metal and the first material on one surface of the light-transmitting dielectric layer.

15. The method of claim 14,
wherein the co-depositing is performed by separately preparing deposition sources of the metal and the first material respectively, and depositing the metal and the first material on the upper surface of the light-transmitting dielectric layer from each of the deposition sources.

16. The method of claim 14,
wherein the co-depositing is performed by using a mixture or alloy of the metal and the first material as a single deposition source.

17. The method of claim 12,
wherein when the first material comprises carbon, the metal comprises one of silver (Ag), aluminum (Al), gold (Au), cobalt (Co), copper (Cu), nickel (Ni), palladium (Pd), platinum (Pt), rhenium (Re), and zinc (Zn).

18. The method of claim 12,
wherein when the first material comprises one of silicon (Si), germanium (Ge), and an Si—Ge alloy, the metal comprises one of silver (Ag), gold (Au), aluminum (Al), and zinc (Zn).

19. The method of claim 12,
wherein the pattern of the metal has a shape in which a plurality of metal nanoparticles spaced apart from each other are distributed.

20. The method of claim 12,
wherein the pattern of the metal has a channel shape extending with a plurality of widths and lengths.

* * * * *